United States Patent [19]

Freyman et al.

[11] Patent Number: 4,546,276

[45] Date of Patent: Oct. 8, 1985

[54] FULL OUTPUT VOLTAGE DRIVER CIRCUIT USING BOOTSTRAP CAPACITOR AND CONTROLLED DELAY CIRCUITRY

[75] Inventors: Ronald L. Freyman, Bethlehem; Yehuda Rotblum, Allentown, both of Pa.

[73] Assignee: AT&T Bell Laboratories, Murray Hill, N.J.

[21] Appl. No.: 402,922

[22] Filed: Jul. 29, 1982

[51] Int. Cl.[4] .................... H03K 4/24; H03K 17/06; H03K 17/687; H03K 19/094
[52] U.S. Cl. ................................ 307/578; 307/482; 307/270; 307/605
[58] Field of Search ............... 307/475, 482, 240, 570, 307/571, 572, 574, 575, 578, 581, 584, 304, 450, 270, 591, 594, 267, 605

[56] References Cited

U.S. PATENT DOCUMENTS

| | | | |
|---|---|---|---|
| 4,071,783 | 1/1978 | Knepper | 307/482 X |
| 4,276,487 | 6/1981 | Arzubi et al. | 307/482 X |
| 4,291,242 | 9/1981 | Schriber | 307/578 X |
| 4,317,051 | 2/1982 | Young, Jr. | 307/270 X |
| 4,342,928 | 8/1982 | Gschwendtner et al. | 307/482 X |

*Primary Examiner*—Stanley D. Miller
*Assistant Examiner*—David R. Bertelson
*Attorney, Agent, or Firm*—David I. Caplan

[57] ABSTRACT

An MOS driver circuit which provides full VDD and VSS output logic levels uses a bootstrap capacitor and a delay circuit whose delay is controlled by potential of the terminal which is bootstrapped. Adverse effects of processing variations are limited because the delay time of the delay circuit is determined by the components which selectively control the potential of the bootstrapped terminal.

16 Claims, 1 Drawing Figure

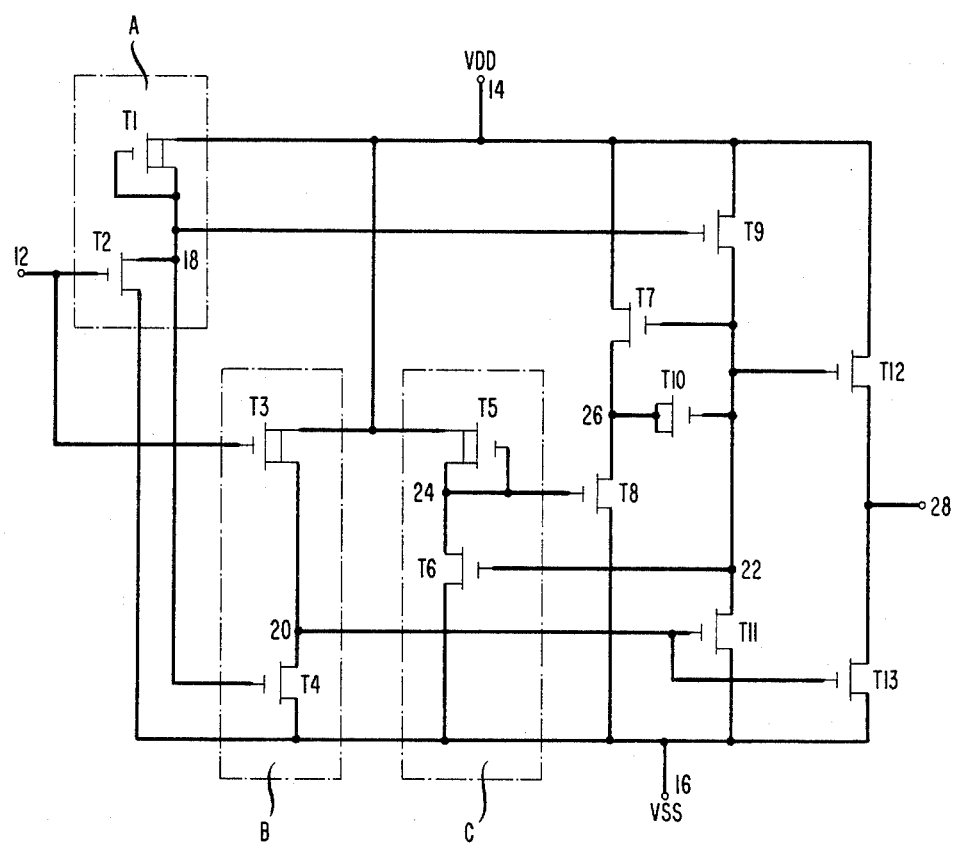

FULL OUTPUT VOLTAGE DRIVER CIRCUIT USING BOOTSTRAP CAPACITOR AND CONTROLLED DELAY CIRCUITRY

BACKGROUND OF THE INVENTION

This invention relates to logic circuitry and in particular to driver circuitry which provides output voltage levels which are essentially the same as the levels of power supplies used with the circuitry.

Many of today's digital integrated circuits use field effect transistors which have a threshold voltage which must be exceeded before the transistor turns ON. This results in at least one of the two output logic levels being a threshold voltage below one of the potential levels of power supplies used with these circuits. It is desirable in some cases to have a full output voltage (logic levels which are the same as the levels of the used power supplies). One solution to threshold voltage losses is driver circuits which use bootstrap capacitors with delay circuits to first charge a terminal to a potential close to a power supply level and then thereafter to capacitively bootstrap the potential level of the terminal to a potential level which is above the level of power supply. One problem with this solution is that the delay introduced by the delay circuits may vary with processing variations differently than the rest of the circuit. This can result in both terminals of the bootstrap capacitor increasing or decreasing in potential at essentially the same time. This can cause the desired output voltage level not to be reached.

It is desirable to have driver circuitry which uses a bootstrap capacitor and delay circuitry in which the delay associated with the delay circuitry is controlled by the terminal of the circuitry which is to be bootstrapped in potential. This would limit the adverse effect of processing variations on the performance of the driver circuitry.

SUMMARY OF THE INVENTION

The present invention is directed to circuitry for generating an output potential level which is essentially the same as the level of a power supply used with the circuit. The normal threshold voltage loss associated with some field effect transistors which causes a reduction in one output potential level is thus effectively eliminated. The circuitry essentially comprises a first field effect transistor, second, third, fourth, and fifth switching devices, a capacitor means having first and second terminals, and delay circuit having an input terminal coupled to the first terminal of the capacitor and having an output terminal coupled to the second terminal of the capacitor means.

The delay means is so configured and coupled to the capacitor means that the first terminal of the capacitor means is first charged, and only after a reference potential is reached by the first terminal does the delay circuit means start to react so as to then thereafter allow the second terminal of the capacitor means to increase in potential so as to thereafter bootstrap the potential of the first terminal to a sufficient level to allow the first transistor to achieve the full potential level of a power supply coupled thereto. Accordingly, the actual delay necessary to effectively bootstrap the first terminal of the capacitor means is controlled at least in part by the potential of said first terminal.

The adverse effects of processing variations which normally occur in integrated circuit manufacturing and limit the operation of conventional bootstrap capacitor circuitry are limited by the use of a delay means as described above herein.

These and other features and advantages of the invention are better understood from a consideration of the following detailed description taken in conjunction with the accompanying drawing.

BRIEF DESCRIPTION OF THE DRAWING

The FIGURE illustrates one embodiment of the present invention.

DETAILED DESCRIPTION

Referring now to the FIGURE, there is illustrated driver circuitry 10 which comprises a first inverter circuit (illustrated within dashed line rectangle A) comprising field effect transistors T1 and T2, a second inverter circuit (illustrated within dashed line rectangle B) comprising field effect transistors T3 and T4, a third inverter circuit (illustrated within dashed line rectangle C) comprising field effect transistors T5 and T6, and field effect transistors T7, T8, T9, T10, T11, T12, and T13.

Circuitry 10 is illustrated coupled by a terminal 14 to a power supply VDD and by a terminal 16 to a second power supply VSS. An input terminal 12 has typically applied thereto a periodically varying signal which has a "1" level which is at or close to VDD in potential and has a "0" level which is at or close to VSS in potential. An output terminal 28 of circuitry 10 is pulsed essentially between the potential levels of VDD and VSS. The full potential level of VDD is achieved at terminal 28.

The drains of T1, T3, T5, T7, T9, and T12 are all coupled to terminal 14. The sources of T2, T4, T6, T8, T11, and T13 are all coupled to terminal 16. The gate and source of T1 are coupled to the drain of T2, to the gates of T4 and T9, and to a terminal 18. Input terminal 12 is coupled to the gates of T2 and T3. The source of T3 is coupled to the drain of T4, to the gates of T11 and T13, and to a terminal 20. The gate and source of T5 are coupled to the drain of T6, to the gate of T8, and to a terminal 24. The source of T7 is coupled to the drain of T8, to the drain and source of T10, and to a terminal 26. The source of T9 is coupled to the gates of T6, T7, and T12, to the gate of T10, and to a terminal 22. The source of T12 is coupled to the drain of T13 and to output terminal 28.

T10 is connected such that it effectively acts as a capacitor with terminal 26 serving as one terminal and terminal 22 serving as a second terminal. T10 may be referred to as a bootstrap capacitor.

T1 and T2 are designed such that when T2 is ON, the potential of terminal 18 is close to VSS, and when T2 is OFF, the potential of terminal 18 is at or near the potential of VDD. T3 and T4 are designed such that with T4 ON, and independent of the potential at the gate of T3, terminal 20 is at or near the potential of VSS. With T4 OFF, the potential of terminal 20 is at or near the potential of VDD. T5 and T6 are designed such that with T6 ON, terminal 24 is at or close to VSS in potential. With T6 OFF, terminal 24 is at or near the potential of VDD. T7 and T8 are designed such that with T7 and T8 both ON, terminal 26 is at or near the potential of VSS. With T7 ON and T8 OFF, terminal 26 is at or near VDD in potential. With T7 OFF and T8 ON, terminal 26 is at or near the potential of VSS.

The operation of circuitry 10 is as follows: With a "1", a potential level at or near the potential of VDD, applied to input terminal 12, terminal 18 assumes a "0", a potential level at or near VSS. Accordingly, T4 and T9 are turned OFF. This causes terminal 20 to assume a "1" which causes T11 and T13 to be turned ON. These conditions cause terminal 22 and output terminal 28 to both be set to "0's" and turns OFF T6 and T7. This causes terminal 24 to assume a "1" and thus turns ON T8 which causes terminal 26 to assume a "0". Accordingly, a "1" applied to input terminal 12 causes output terminal 28 to be set to a "0".

Now assume that input terminal 12 is pulsed from a "1" to a "0". Terminal 18 is pulsed to a "1", and thus T4 and T9 are both turned ON. With T4 ON, terminal 20 is pulsed to a "0". This turns OFF T11 and T13. T9, being now ON, causes terminal 22 to be switched from a "0" to a potential level which is close to but below that of VDD. This potential on terminal 22 now turns ON T6, which causes terminal 24 to be set to a "0". This condition, in turn, turns OFF T8. Accordingly, because T7 is ON, terminal 26 now rises in potential from a "0" to a level close to but below VDD. This causes the positive-going voltage waveform appearing at terminal 26 to be capacitively coupled to terminal 22 and to thus raise the potential of terminal 22 from a level which is close to, but below VDD, to a potential level which is above VDD by at least the threshold voltage of T12. This causes T12 to turn ON and allows the full potential level of VDD, a "1", to appear at output terminal 28. Accordingly, a "0" applied to input terminal 12 causes output terminal 28 to be set to a "1".

Circuitry 10 is specifically designed to ensure that terminal 26 is pulsed from a "0" to a "1" essentially only after terminal 22 has already reached a "1". This helps ensure that terminal 22 reaches a potential level which is at least the threshold voltage of T12 above the potential level of VDD. This is accomplished because: (1) T9 turns ON before T11 turns OFF, and thus terminal 22 begins to increase in potential towards a "1" before T11 is turned OFF; (2) T6 does not turn ON until terminal 22 rises at least one threshold voltage above VSS; (3) T8 does not turn OFF until terminal 24 drops to below one threshold voltage above VSS; and (4) Terminal 26 essentially does not substantially increase in potential until T8 is turned OFF.

It is to be noted that T11 and terminal 22 serve several purposes in circuitry 10. A first purpose is to allow terminal 22 to be selectively discharged by T11 at appropriate times during the operation of circuitry 10. A second purpose is to form part of a delay circuit that also includes T5 and T6 and which causes signals appearing at terminal 20 to appear at terminal 24 after a period of time which is determined by T11, T5 and T6, and by the potential on terminal 22 which is selectively controlled by T1 and T9. T8 adds additional delay as terminal 26 can only increase in potential when T8 is switched OFF.

Circuitry 10 thus acts to only selectively allow terminal 26 to increase in potential from a "0" to a "1" essentially after terminal 22 has reached the "1" level. This results in a bootstrap operation which increases the potential level of terminal 22 from a value near, but below that of VDD, to a potential which is at least the threshold voltage of T12 above VDD. This results in the "1" level appearing at output terminal 28 being of essentially the same level as VDD.

An R-C type of simple delay circuit (not illustrated) could be connected between terminals 20 and 24, and T5 and T6 could be eliminated. One problem with this type of substitution is that integrated circuit processing changes might vary the delay of delay circuit differently than that of the rest of circuitry 10. This could cause terminal 26 to be increased in potential while terminal 22 was also being increased in potential which could lead to terminal 22 not reaching a potential level above VDD. This would result in the output potential at terminal 28 not attaining a full VDD level.

Circuitry 10 has been fabricated as part of a silicon integrated circuit. Transistors T1, T3, T5, and T10 are n-channel depletion field effect transistors, and transistors T2, T4, T6, T7, T8, T9, T11, T12, and T13 and n-channel enhancement transistors. VDD = +5 volts and VSS=0 volts. An input "1" has a potential level of approximately +4 volts, and an input "0" has a potential level of approximately 0 volts. The frequency of the signal applied to input terminal 12 is 10 MHz. T12 and T13 are essentially identical in physical size and have essentially the same resistance. T7 is approximately one-fourth the size of T8 and has four times the resistance. T1, T3, and T5 have approximately four times the resistance of T2, T4, and T6, respectively. Fabricated circuitry 10 has been tested and found to be functional.

The embodiments described herein are intended to be illustrative of the general principles of the present invention. Various modifications are possible consistent with the spirit of the invention. For example, complementary input signals can be applied directly to terminals 18 and 20, respectively, and inverter circuits A and B can be eliminated. Still further, inverter circuit C can be a variety of types of inverter circuits which produce essentially the same delay from input to output, as do T5 and T6. Still further, T10 can be replaced by a variety of different types of capacitors such as an enhancement field effect transistor. Still further, the n-channel depletion transistors could be replaced by n-channel enhancement transistors. Still further, all n-channel transistors could be replaced by p-channel transistors, provided the polarity of power supplies and input signals is appropriately changed. Still further, the gate of T3 could be coupled to the source thereof instead of to input terminal 12.

What is claimed is:

1. Circuitry comprising:
   a first field effect transistor switching device having a gate terminal and first and second terminals;
   a second switching device having a first terminal, a second terminal, and a control terminal, the first terminal thereof being coupled to the first terminal of the first field effect transistor device;
   a circuitry output terminal being coupled to the first terminal of the first field effect transistor device;
   a third switching device having a first terminal, a second terminal, and a control terminal, the first terminal thereof being coupled to the gate terminal of the first transistor device;
   a fourth switching device having a control terminal, a first terminal, and a second terminal;
   a circuitry input terminal being coupled to the control terminals of the third and fourth switching devices;
   a fifth switching device having a control terminal, a first terminal, and a second terminal;

a capacitor means having a first terminal coupled to the first terminals of the third and fourth devices, and to the control terminal of the fifth device;

the first terminal of the fifth device being coupled to a second terminal of the capacitor means;

the second terminals of the first, third, and fifth switching devices being connectable to a first potential terminal;

the second terminals of the second and fourth switching devices being connectable to a second potential terminal; and delay circuit means having first and second terminals coupled to the first and second terminals of the capacitor means, respectively.

2. The circuitry of claim 1 wherein:

the delay circuit means comprises sixth and seventh switching devices which each have a control terminal and first and second terminals;

the control and first terminal of the seventh device being coupled to the first terminal of the capacitor means and to the control terminal of the sixth switching device, respectively; and the first terminal of the sixth switching device being coupled to the second terminal of the capacitor means, the second terminals of said sixth and seventh switching devices being connectable to said second potential terminal.

3. The circuitry of claim 2 wherein the delay circuit means further comprises a first load device coupled to the first terminal of the seventh switching device.

4. The circuitry of claim 3 wherein the first load device is an eighth switching device having a control terminal and a first terminal which are both coupled to the first terminal of the seventh switching device.

5. The circuitry of claim 4 wherein:

the sixth, seventh, and eighth switching devices each has a separate second terminal;

the second terminal of the eighth switching device being coupled together and being connectable to the first potential source; and the second terminals of the sixth and seventh switching devices being coupled together and connectable to the second potential source.

6. The circuitry of claim 5 further comprising:

first and second inverter circuits each having an input terminal and an output terminal;

the input terminal of the first inverter circuit serving as the circuitry input terminal;

the output terminal of the first inverter circuit being coupled to the control terminal of the third switching device and to the input terminal of the second inverter circuit; and the output terminal of the second inverter circuit being coupled to the control terminals of the second and fourth switching devices.

7. The circuitry of claim 6 wherein:

the first inverter circuit comprises a ninth switching device having a control terminal and first and second terminals, and further comprises a second load device having first and second terminals;

the first terminal of the ninth switching device and the first terminal of the second load device being coupled to the output termnal of the first inverter circuit;

the second inverter circuit comprises a tenth switching device having a control terminal and first and second terminals, and further comprises a third load device having first and second terminals;

the control terminal of the tenth switching device being coupled to the input terminal of the second inverter circuit;

the second terminals of the ninth and tenth switching devices being coupled to the second terminal of the seventh switching device; and the first terminal of the tenth switching device and the first terminal of the third load device being coupled to the output terminal of the second inverter circuit.

8. The circuitry of claim 7 wherein:

the second and third load devices each comprise eleventh and twelfth switching devices, respectively, which each have a control terminal and first and second terminals;

the control and first terminals of the eleventh switching device being coupled to the first terminal of the ninth switching device;

the control and first terminal of the twelfth switching device being coupled to the control terminal of the ninth switching device and to the first terminal of the tenth switching device, respectively; and the second terminals of the eleventh and twelfth switching devices being coupled to the second terminal of the eighth switching device.

9. The circuitry of claim 8 wherein:

the second, third, fourth, fifth, sixth, seventh, eighth, ninth, tenth, eleventh, and twelfth switching devices are separate field effect transistors.

10. The circuitry of claim 9 where the capacitor means comprises a thirteenth field effect transistor having a gate terminal coupled to the gate terminal of the first field effect transistor and having source and drain terminals coupled to the first terminal of the the fifth switching device.

11. The circuitry of claim 10 wherein the transistors are all n-channel field effect transistors.

12. The circuitry of claim 10 wherein the first, second, third, fourth, fifth, sixth, seventh, ninth, switching devices are enhancement mode n-channel field effect transistors.

13. The circuitry of claim 12 wherein the eighth, eleventh, and twelfth switching devices and the capacitor means are n-channel depletion mode field effect transistors.

14. The circuitry of claim 10 wherein the transistors are all p-channel field effect transistors.

15. The circuitry of claim 14 wherein the first, second, third, fourth, fifth, sixth, seventh, ninth, and tenth switching devices are enhancement mode p-channel field effect transistors.

16. The circuitry of claim 14 wherein the eighth, eleventh, and twelfth switching devices and the capacitor means are p-channel depletion mode field effect transistors.

* * * * *